United States Patent
Luo

(10) Patent No.: US 10,950,670 B2
(45) Date of Patent: Mar. 16, 2021

(54) DISPLAY PANEL

(71) Applicant: Wuhan China Star Optoelectronics Semiconductor Display Technology Co., Ltd., Wuhan (CN)

(72) Inventor: Yaju Luo, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 60 days.

(21) Appl. No.: 16/467,985

(22) PCT Filed: Feb. 14, 2019

(86) PCT No.: PCT/CN2019/075006
§ 371 (c)(1),
(2) Date: Jun. 10, 2019

(87) PCT Pub. No.: WO2020/124762
PCT Pub. Date: Jun. 25, 2020

(65) Prior Publication Data
US 2020/0194507 A1    Jun. 18, 2020

(30) Foreign Application Priority Data
Dec. 17, 2018 (CN) .......................... 201811543814.4

(51) Int. Cl.
*H01L 27/32* (2006.01)
*H01L 51/00* (2006.01)
*H01L 51/52* (2006.01)

(52) U.S. Cl.
CPC ........ *H01L 27/323* (2013.01); *H01L 51/0097* (2013.01); *H01L 51/5246* (2013.01); *H01L 2251/5338* (2013.01)

(58) Field of Classification Search
CPC ............... H01L 27/323; H01L 51/5246; H01L 51/0097; G02F 1/133308
See application file for complete search history.

(56) References Cited

U.S. PATENT DOCUMENTS

| 2009/0014204 | A1   | 1/2009  | Wang et al.              |
| 2012/0120364 | A1   | 5/2012  | Wu et al.                |
| 2016/0275830 | A1 * | 9/2016  | You ............ G02F 1/133305 |
| 2016/0351594 | A1   | 12/2016 | Shangguan et al.         |
| 2018/0151641 | A1   | 5/2018  | Choo et al.              |
| 2019/0206898 | A1 * | 7/2019  | Baek ............... H01L 27/124 |

(Continued)

FOREIGN PATENT DOCUMENTS

| CN | 1760727   | 4/2006 |
| CN | 101346035 | 1/2009 |
| CN | 201548777 | 8/2010 |

(Continued)

*Primary Examiner* — Marcos D. Pizarro
*Assistant Examiner* — Antonio B Crite

(57) ABSTRACT

A display panel is provided. The display panel includes a first back board, a first substrate, a touch panel, and an adhesive layer, wherein the first substrate is disposed on the first back board, the touch panel is located above the first substrate, and a first connecting end of the adhesive layer connects the first substrate. The first back board includes a first end surface, the first end surface is close to the adhesive layer, and the first end surface has a free curved shape.

18 Claims, 3 Drawing Sheets

(56) References Cited

U.S. PATENT DOCUMENTS

2020/0233245 A1* 7/2020 Li .......................... G09F 9/301

FOREIGN PATENT DOCUMENTS

| CN | 102157110 | 8/2011 |
| CN | 104851364 | 8/2015 |
| CN | 205013537 | 2/2016 |
| CN | 207264694 | 4/2018 |
| CN | 108109523 | 6/2018 |

* cited by examiner

DISPLAY PANEL

RELATED APPLICATIONS

This application is a National Phase of PCT Patent Application No. PCT/CN2019/075006 having International filing date of Feb. 14, 2019, which claims the benefit of priority of Chinese Patent Application No. 201811543814.4 filed on Dec. 17, 2018. The contents of the above applications are all incorporated by reference as if fully set forth herein in their entirety.

FIELD AND BACKGROUND OF THE INVENTION

The present disclosure relates to a display panel, and in particular to a display panel with an organic light emitting diode.

An organic light emitting diode (OLED) display is a self-luminous display. According to a driving method, it can be divided into a passive matrix driven organic light emitting diode (PMOLED) display and an active matrix driven organic light emitting diode (AMOLED) display. AMOLED displays have advantages, such as low manufacturing cost, high response speed, power saving, DC drive for portable devices, and a wide operating temperature range. Therefore, more and more AMOLED displays are used in a variety of displays with high performance.

However, an end surface of a back board of the AMOLED display is in a plane. During a bending process, the end surface of the back board generates an outward stress, and the stresses are concentrated in the same direction, thereby causing the end surface of the back board to be crushed by an adjacent flexible circuit board to cause chipping, and the product yield of the AMOLED display is reduced.

As a result, it is necessary to provide a display panel to solve the problems existing in the conventional technologies, as described above.

SUMMARY OF THE INVENTION

An object of the present disclosure is to provide a display panel, wherein the stress of a first end surface of the first back board is reduced in the same direction by the design of a plurality of first protrusions, thereby preventing the first back board from being chipped.

To achieve the above objects, the present disclosure provides a display panel, and the display panel comprises a first back board, a first substrate, a touch panel, and an adhesive layer, wherein the first substrate is disposed on the first back board, the touch panel is located above the first substrate, and a first connecting end of the adhesive layer connects the substrate; the first back board includes a first end surface, the first end surface is close to the adhesive layer, and the first end surface has a free curved shape; the display panel is applied in an active matrix driven organic light emitting diode display.

In one embodiment of the present disclosure, the first end surface includes an arc shape sequentially arranged, and is formed with a plurality of first protrusions, the first protrusion includes a radius of curvature of 0.5 to 10 mm.

In one embodiment of the present disclosure, the display panel further includes a second substrate, a second back board, a stiffener, and a conductive layer, wherein the second back board is disposed on the second substrate, the stiffener is disposed on the second back board, the conductive layer is disposed between the stiffener and the first back board, and a second connecting end of the adhesive layer connects to the second substrate.

In one embodiment of the present disclosure, the second back board includes a second end surface, the second end surface is close to the adhesive layer, and the second end surface has a free curved shape.

In one embodiment of the present disclosure, the second end surface includes an arc shape sequentially arranged, and is formed with a plurality of second protrusions, the second protrusion includes a radius of curvature of 0.5 to 10 mm.

In one embodiment of the present disclosure, the display panel further includes a polarizing plate, and the polarizing plate is disposed on the touch panel.

In one embodiment of the present disclosure, the display panel further includes a first optical adhesive layer, and the first optical adhesive layer is disposed on the polarizing plate.

In one embodiment of the present disclosure, the display panel further includes a cover glass, and the cover glass is disposed on the first optical adhesive layer.

In one embodiment of the present disclosure, the display panel further includes a second optical adhesive layer, and the second optical adhesive layer is disposed between the touch panel and the first substrate.

In one embodiment of the present disclosure, the display panel further includes a flexible circuit board, and a first connecting end of the flexible circuit board connects to the touch panel.

To achieve the above objects, the present disclosure provides a display panel, and the display panel comprises a first back board, a first substrate, a touch panel, and an adhesive layer, wherein the first substrate is disposed on the first back board, the touch panel is located above the first substrate, and a first connecting end of the adhesive layer connects the substrate; the first back board includes a first end surface, the first end surface is close to the adhesive layer, and the first end surface has a free curved shape.

In one embodiment of the present disclosure, the first end surface includes an arc shape sequentially arranged, and is formed with a plurality of first protrusions, the first protrusion includes a radius of curvature of 0.5 to 10 mm.

In one embodiment of the present disclosure, the display panel further includes a second substrate, a second back board, a stiffener, and a conductive layer, wherein the second back board is disposed on the second substrate, the stiffener is disposed on the second back board, the conductive layer is disposed between the stiffener and the first back board, and a second connecting end of the adhesive layer connects to the second substrate.

In one embodiment of the present disclosure, the second back board includes a second end surface, the second end surface is close to the adhesive layer, and the second end surface has a free curved shape.

In one embodiment of the present disclosure, the second end surface includes an arc shape sequentially arranged, and is formed a plurality of second protrusions, the second protrusion includes a radius of curvature of 0.5 to 10 mm.

In one embodiment of the present disclosure, the display panel further includes a polarizing plate, and the polarizing plate is disposed on the touch panel.

In one embodiment of the present disclosure, the display panel further includes a first optical adhesive layer, and the first optical adhesive layer is disposed on the polarizing plate.

In one embodiment of the present disclosure, the display panel further includes a cover glass, and the cover glass is disposed on the first optical adhesive layer.

In one embodiment of the present disclosure, the display panel further includes a second optical adhesive layer, and the second optical adhesive layer is disposed between the touch panel and the first substrate.

In one embodiment of the present disclosure, the display panel further includes a flexible circuit board, and a first connecting end of the flexible circuit board connects to the touch panel.

The beneficial effect is that the stress of the first protrusions is diverged by forming the first protrusions on the first end surface of the first back board. Therefore, the stress of the first end surface of the first back board 2 are prevented from being concentrated in the same direction, and the first back board is prevented from being chipped to improve the fabrication yield of the active matrix driven organic light emitting diode display.

BRIEF DESCRIPTION OF THE SEVERAL VIEWS OF THE DRAWINGS

In order to more clearly illustrate the embodiments or prior art technical solutions embodiment of the present disclosure, will implement the following figures for the cases described in prior art or require the use of a simple introduction. Obviously, the following description of the drawings are only some of those of ordinary skill in terms of creative effort without precondition, you can also obtain other drawings based on these drawings embodiments of the present disclosure.

DESCRIPTION OF SPECIFIC EMBODIMENTS OF THE INVENTION

Structure and technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Figure 1:
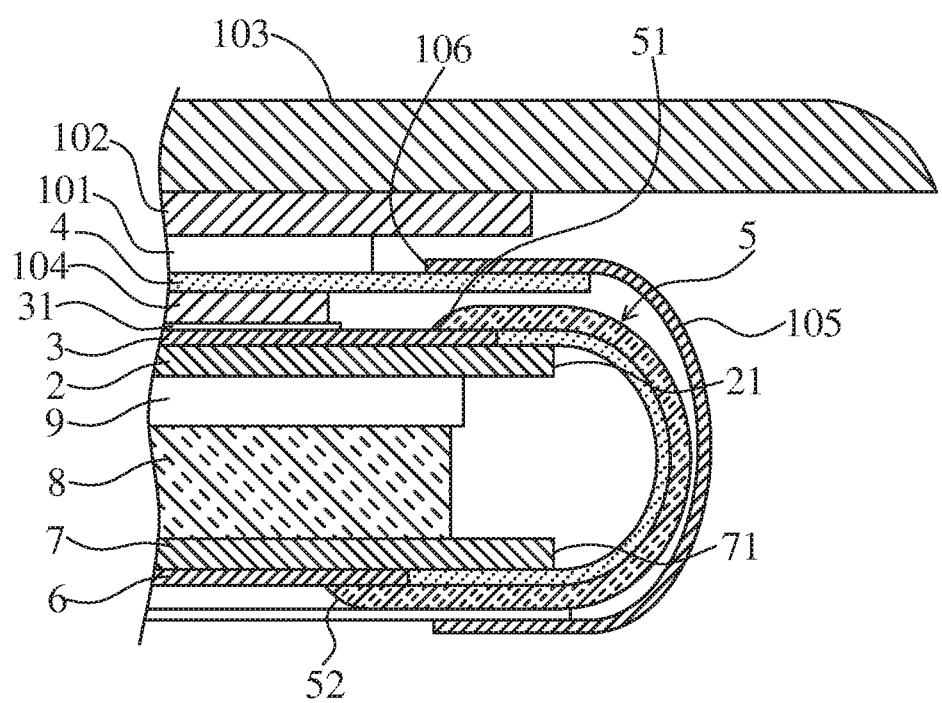
FIG. 1 is a schematic view of a display panel according to a preferred embodiment of the present disclosure.

Referring to FIG. 1, a schematic view of a display panel according to a preferred embodiment of the present disclosure is illustrated. The display panel is applied in an active matrix driven organic light emitting diode display, and the display includes a first back board 2, a first substrate 3, a touch panel 4, and an adhesive layer 5 (UV Glue). The detailed structure of each component, assembly relationships, and operating principles in the present invention will be described in detail hereinafter.

Figure 2:
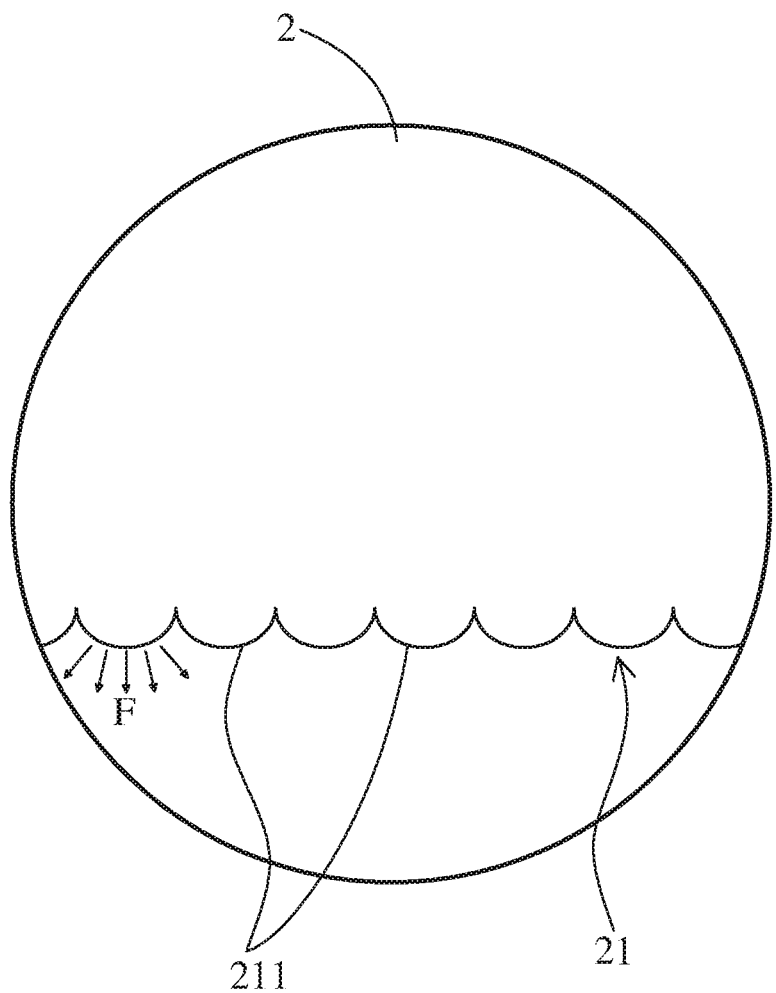
FIG. 2 is a top view of a first back board of the display panel according to a preferred embodiment of the present disclosure.

Referring to FIGS. 1 and 2, the first substrate 3 is disposed on the first back board 2, and the first substrate 3 includes a thin film transistor layer 31. The touch panel 4 is disposed on the thin film transistor layer 31 and located above the first substrate 3. A first connecting end of the adhesive layer 5 connects the first substrate 3, wherein the first back board 2 includes a first end surface 21, the first end surface 21 is close to the adhesive layer 5, and the first end surface 21 has a free curved shape. In the embodiment, the first end surface 21 includes an arc shape sequentially arranged, and is formed with a plurality of first protrusions 211 (shown in FIG. 2), wherein the first protrusions 211 are sequentially arranged, and the first protrusion 211 includes a radius of curvature of 0.5 to 10 mm, preferably 1 mm.

Figure 3:
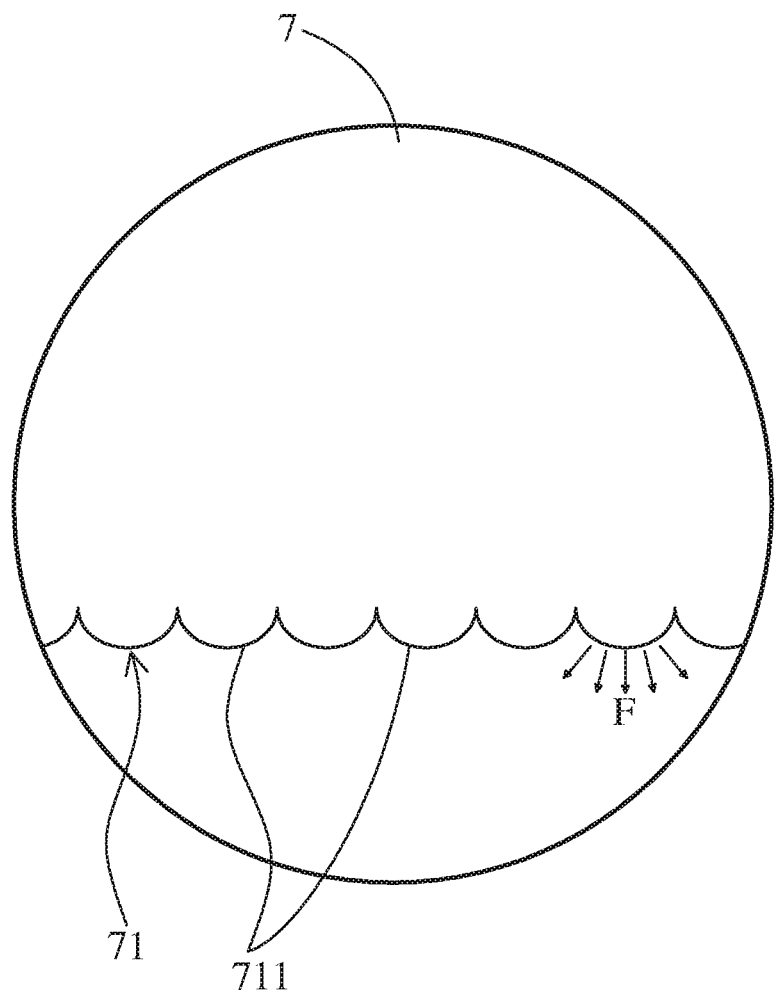
FIG. 3 is a top view of a second back board of the display panel according to a preferred embodiment of the present disclosure.

Referring to FIGS. 1 and 3, the display panel further includes a second substrate 6, a second back board 7, a stiffener 8, and a conductive layer 9, wherein the second back board 7 is disposed on the second substrate 6, the stiffener 8 is disposed on the second back board 7, the conductive layer 9 is disposed between the stiffener 8 and the first back board 2, and a second connecting end 52 of the adhesive layer 5 connects to the second substrate 6. In the embodiment, the first substrate 3 and the second substrate 6 are active matrix organic light emitting diode (AMOLED) screens.

Referring to FIGS. 1 and 3, the second back board 7 includes a second end surface 71, the second end surface 71 is close to the adhesive layer 5, and the second end surface 71 has a free curved shape. In the embodiment, the second end surface 71 includes an arc shape sequentially arranged, and is formed with a plurality of first protrusions 711 (shown in FIG. 3), wherein the second protrusions 711 are sequentially arranged, and the second protrusion 711 includes a radius of curvature of 0.5 to 10 mm, preferably 1 mm.

Referring to FIGS. 1 and 2, the display panel further includes a polarizing plate 101, a first optical adhesive layer 102, a cover glass 103, a second optical adhesive layer 104, and a flexible circuit board 105, wherein the polarizing plate 101 is disposed on the touch panel 4, the first optical adhesive layer 102 is disposed on the polarizing plate 101, the cover glass 103 is disposed on the first optical adhesive layer 102, the second optical adhesive layer 104 disposed between the touch panel 4 and the first substrate 3, and a first connecting end 106 of the flexible circuit board 105 connects to the touch panel 4.

As described above, by forming the first protrusions 211 on the first end surface 21 of the first back board 2 and forming the second protrusions 711 on the second end surface 71 of the second back board 7, the stress F of the first protrusions 211 and the second protrusions 711 is diverged (as shown in FIGS. 2 and 3). Therefore, the stress of the first end surface 21 of the first back board 2 and the second end surface 71 of the second back board 7 are prevented from being concentrated in the same direction, and the first back board 2 and the second back board 7 are prevented from being chipped to improve the product yield of the active matrix driven organic light emitting diode display.

What is claimed is:
1. A display panel, comprising:
   a first back board, a first substrate, a touch panel, and an adhesive layer, wherein the first substrate is disposed on the first back board, the touch panel is located above the first substrate, and a first connecting end of the adhesive layer connects the first substrate; the first back board includes a first end surface, the first end surface is close to the adhesive layer, and the first end surface has a free curved shape; the display panel is applied in an active matrix driven organic light emitting diode display; the first end surface includes an arc shape sequentially arranged, and is formed with a plurality of first protrusions, and the first protrusion includes a radius of curvature of 0.5 to 10 mm.

2. The display panel according to claim 1, wherein a plurality of first contact pads and the plurality of second contact pads are formed in a non-display area of the display panel.

3. The display panel according to claim 2, wherein the display panel further includes a flexible circuit board, and a first connecting end of the flexible circuit board connects to the touch panel.

4. The display panel according to claim 1, wherein the display panel further includes a second substrate, a second back board, a stiffener, and a conductive layer, wherein the second back board is disposed on the second substrate, the stiffener is disposed on the second back board, the conductive layer is disposed between the stiffener and the first back board, and a second connecting end of the adhesive layer connects to the second substrate.

5. The display panel according to claim 4, wherein the second back board includes a second end surface, the second end surface is close to the adhesive layer, and the second end surface has a free curved shape.

6. The display panel according to claim 5, wherein the second end surface includes an arc shape sequentially arranged, and is formed with a plurality of second protrusions, the second protrusion includes a radius of curvature of 0.5 to 10 mm.

7. The display panel according to claim 1, wherein the display panel further includes a polarizing plate, and the polarizing plate is disposed on the touch panel.

8. The display panel according to claim 7, wherein the display panel further includes a first optical adhesive layer, and the first optical adhesive layer is disposed on the polarizing plate.

9. The display panel according to claim 8, wherein the display panel further includes a cover glass, and the cover glass is disposed on the first optical adhesive layer.

10. A display panel, comprising:
a first back board, a first substrate, a touch panel, and an adhesive layer, wherein the first substrate is disposed on the first back board, the touch panel is located above the first substrate, and a first connecting end of the adhesive layer connects the first substrate; the first back board includes a first end surface, the first end surface is close to the adhesive layer, and the first end surface has a free curved shape; the first end surface includes an arc shape sequentially arranged, and is formed with a plurality of first protrusions, and the first protrusion includes a radius of curvature of 0.5 to 10 mm.

11. The display panel according to claim 10, wherein a plurality of first contact pads and the plurality of second contact pads are formed in a non-display area of the display panel.

12. The display panel according to claim 11, wherein the display panel further includes a flexible circuit board, and a first connecting end of the flexible circuit board connects to the touch panel.

13. The display panel according to claim 10, wherein the display panel further includes a second substrate, a second back board, a stiffener, and a conductive layer, wherein the second back board is disposed on the second substrate, the stiffener is disposed on the second back board, the conductive layer is disposed between the stiffener and the first back board, and a second connecting end of the adhesive layer connects to the second substrate.

14. The display panel according to claim 13, wherein the second back board includes a second end surface, the second end surface is close to the adhesive layer, and the second end surface has a free curved shape.

15. The display panel according to claim 14, wherein the second end surface includes an arc shape sequentially arranged, and is formed a plurality of second protrusions, the second protrusion includes a radius of curvature of 0.5 to 10 mm.

16. The display panel according to claim 10, wherein the display panel further includes a polarizing plate, and the polarizing plate is disposed on the touch panel.

17. The display panel according to claim 16, wherein the display panel further includes a first optical adhesive layer, and the first optical adhesive layer is disposed on the polarizing plate.

18. The display panel according to claim 17, wherein the display panel further includes a cover glass, and the cover glass is disposed on the first optical adhesive layer.

* * * * *